United States Patent [19]

O'Hara

[11] Patent Number: 5,682,415
[45] Date of Patent: Oct. 28, 1997

[54] COLLIMATOR FOR X-RAY SPECTROSCOPY

[76] Inventor: David B. O'Hara, P.O. Box 12212, Tallahassee, Fla. 32317-2212

[21] Appl. No.: 543,170

[22] Filed: Oct. 13, 1995

[51] Int. Cl.$^6$ .............................................. G21K 1/02
[52] U.S. Cl. ............................... 378/147; 378/85; 378/43
[58] Field of Search ....................................... 378/145, 147, 378/43, 84, 85

[56] References Cited

U.S. PATENT DOCUMENTS

| | | | |
|---|---|---|---|
| 1,865,441 | 7/1932 | Mutscheller | 378/145 |
| 3,143,651 | 8/1964 | Giacconi et al. | 378/43 |
| 4,063,088 | 12/1977 | Dailey | 378/43 |

*Primary Examiner*—Craig E. Church
*Attorney, Agent, or Firm*—Enrique G. Estevez

[57] ABSTRACT

The invention claimed is a collimator for x-rays and the fabrication process for said collimator. The collimator, in its preferred embodiment, displays the general shape of a tube, having two apertures, an entrance aperture and an exit aperture. The walls of the collimator tube are not parallel to each other but rather are paraboloidal in longitudinal section. The geometry of the collimator tube is, therefore, circular in transverse cross-section and paraboloidal in longitudinal section, thereby resulting in a tube whose entrance aperture is of a smaller diameter than its exit aperture. The collimator geometry described is referred to herein as a tubular paraboloid. The preferred embodiment comprises a first tubular paraboloid, or first reflector, and a second tubular paraboloid, or second reflector, each having an outer surface and an ultrasmooth, reflecting inner surface, the second reflector being of smaller diameter than the first reflector and being held by suitable means in assembly concentrically with the first reflector, thereby defining an entrance aperture and an exit aperture. Alternate embodiments may employ more than two nested paraboloid reflectors and may also comprise a truncated cone reflector at the entrance aperture to provide a two reflection figure. In addition, the process developed is suitable for fabrication of optics with very small apertures and ultra smooth interior reflecting surfaces. Many types of reflecting surfaces may be produced, including gold, copper, nickel, palladium and others. The process is a replication method, so that once a master surface for an optic has been prepared, subsequent copies can be inexpensively reproduced. Thus, the fabrication process described is best suited for the production of many identical optics, rather than one-of-a-kind devices, and in a variety of unusual geometries in addition to tubular paraboloids.

10 Claims, 4 Drawing Sheets

REFLECTIVITY AT 4 DEGREES (68 mrad) GRAZING ANGLE

COLLIMATOR FOR X-RAY SPECTROSCOPY

The claimed invention was made with financial support from the United States Government and the inventor hereby acknowledges that the government has certain rights in the invention, as specified by law.

BACKGROUND—FIELD OF INVENTION

This invention relates to the field of x-ray optics, specifically to a device to collimate x-rays and a method for its fabrication.

BACKGROUND—DESCRIPTION OF PRIOR ART

Elemental analysis using low energy x-ray spectroscopy.

The following patents claim various devices for reflecting or collimating x-rays and methods of fabrication that demonstrate similarities to the present invention: U.S. Pat. No. 5,333,166 teaches a self-apodizing collimator for x-ray lithography; U.S. Pat. No. 4,916,721 teaches a normal incidence x-ray mirror for chemical microanalysis; U.S. Pat. No. 4,317,036 teaches a scanning x-ray microscope; U.S. Pat. No. 4,242,588 teaches an x-ray lithography system having collimating optics; U.S. Pat. No. 5,394,451 teaches an optical arrangement for exposure apparatus; U.S. Pat. No. 5,274,435 teaches grating monochromators and spectrometers based on surface normal rotation; U.S. Pat. No. 5,268,951 teaches an x-ray beam scanning method for producing low distortion or constant distortion in x-ray proximity printing; U.S. Pat. No. 5,016,267 teaches an instrumentation for conditioning x-ray or neutron beams; U.S. Pat. No. 2,819,404 teaches optical image-forming mirror systems having aspherical reflecting surfaces; U.S. Pat. No. 4,785,470 teaches reflectivity and resolution x-ray dispersive and reflective structures for carbon, beryllium and boron analysis; U.S. Pat. No. 4,897,151 teaches a method for fabricating a dichroic parabolic lens reflector; U.S. Pat. No. 5,265,143 teaches an x-ray optical element including a multilayer coating; U.S. Pat. No. 5,384,817 teaches an x-ray optical element and method for its manufacture. In addition, the following prior art publications are cited as potentially relevant to the present invention: J. A. Nousek, et al., Diamond-turned lacquer-coated soft x-ray telescope mirrors, *SPIE*, Vol. 830, Grazing Incidence Optics for Astronomical and Laboratory Applications (1987), pp. 95–97; R. Petre and P. J. Serlemitsos, Conical imaging mirrors for high-speed x-ray telescopes, *Applied Optics*, Vol. 24 (No. 12), June 1985, pp. 1833–1837; J. F. Young, et al., Grazing-incidence ellipsoidal reflector for longitudinally pumping short-wavelength lasers, *Optical Letters*, Vol. 12 (No. 2), Feb. 1987, pp. 90–92; R. Hudec, et al., Grazing incidence replica optics for astronomical and laboratory applications, *Applied Optics*, Vol. 27 (No. 8), April 1988, pp. 1453–1455; M. P. Ulmer, et al., Electroformed x-ray mirrors from lacquer-polished masters, *Plating and Surface Finishing*, October 1990, pp. 23–25; O. Citterio, et al., Optics for x-ray concentrators on board of the astronomy satellite SAX, *SPIE*, Vol. 597, x-ray Instrumentation in Astronomy (1985), pp. 102–110.

Elemental analysis by x-ray spectroscopy is frequently incorporated in scanning electron microscopy (SEM), transmission electron microscopy (TEM), scanning transmission electron microscopy (STEM) and electron microprobes through systems which resolve the x-rays emitted from the sample into a spectrum of elemental x-ray lines of differing energies, designated as K, L or M lines. These x-rays are produced when the electron beam is focused on the sample, causing an incident electron to remove an inner shell electron from the material. An outer shell electron fills the place of the displaced inner shell electron, resulting in emission of an x-ray photon. Such radiative transitions produce x-ray photons of unique energy, by which the element can be identified.

In addition to radiative transitions, there may be radiationless transitions, such as Auger transitions, by which a lower energy level is filled. These radiationless transitions reduce the emission intensity of characteristic x-rays. The probability of an inner shell vacancy being filled by a radiative transition is a function of increasing atomic number (Z); at low atomic numbers the probability of radiative transitions is very low. For example, where Z is lower than 20, the L radiation band is of extremely low intensity and for Z lower than 10 even the K shell radiation is difficult to detect with good signal to noise ratio.

A further problem in resolving the radiation from low Z elements is that it is superimposed on a background continuum of mostly higher energy radiation which contributes to the noise in the detector. Most solid state detectors used in these systems have poor energy resolution, which makes x-ray lines appear as broad peaks, thereby making it difficult to separate closely spaced lines. Detector resolution is dependent on detector size due to capacitance, so that while a small detector is needed for good energy resolution, a large one is required to collect an adequate solid angle of x-rays. Using only energy dispersion in the detector, it is frequently difficult to get good information on small concentrations of the low Z elements. An optic which would allow a small detector to accept a large solid angle of x-rays and also act as a low energy pass filter to remove most of the background continuum would make analysis of small concentrations of low Z elements by energy dispersive spectroscopy much more feasible.

Wavelength dispersive spectroscopy, as illustrated in FIG. 1, has been used when it is necessary to resolve the low Z elements in a sample, particularly at low concentrations. The x-rays diverging from a small spot are collimated by a set of slits or small holes and a narrow cone is allowed to reflect from a wavelength dispersing element such as a crystal or multilayer, also known as a Bragg element. Specific wavelengths are reflected at specific incident angles, as given by the Bragg relation:

$$n\lambda = 2 d \sin\theta$$

where
$n = 1, 2, 3 \ldots$ (an integer)
$\lambda$ = x-ray wavelength
d = layer thickness
$\Theta$ = reflection grazing angle The dispersing element is rotated to present varying incident angles (there are other schemes involving curved crystals and other devices) and the detector scans the reflecting angles. Signal to noise ratio is good in such a system because the background continuum does not reach the detector, since it does not satisfy the Bragg relation. Unlike an energy-dispersing spectrometer system (EDS), in which the photon energies are determined solely by the detector system, which results in poor energy resolution, the energy resolution of the wavelength dispersive spectrometer (WDS) is determined by the properties of the Bragg dispersing element, which has intrinsically good energy resolution.

A major disadvantage of wavelength dispersive spectroscopy, however, is that the dispersing element accepts a very small solid angle, so that most radiation is discarded before it reaches the element. In most systems the half-cone angle of the radiation accepted at the crystal is less than 2 degrees, compared to at least 10 degrees for an energy dispersive system. This small solid angle (0.0038 sr) results in very low x-ray photon flux and, consequently, in very long data collection times. For these reasons wavelength dispersive spectroscopy has not gained wide usage for analysis of low Z elements. An optic which would collect a large solid angle of x-rays diverging from a spot and redirect them in a well collimated beam onto the dispersing crystal would provide sufficient flux gain to make wavelength dispersive spectroscopy a more advantageous analytical technique. X-ray optics.

Grazing incidence reflection of x-rays via total external reflection has been known for decades but it has been difficult to fabricate practical devices using this principle in any reasonable quantity due to the unusual surface shapes necessary and the demandingly low surface roughness required. Such optics have been made using bent sheets of glass, arrays of microcapillaries, bent microchannel plates and large electroformed mirror shells.

For various reasons, however, all these concepts are impractical in SEM, TEM, STEM, synchrotron and x-ray laser applications. For example, micro-capillaries and bent microchannel plates have poor throughput at low energies (<2000 eV) due to mismatch of the reflecting surface optical constants for very low energies. Electroformed mirror shells, such as in the AXAF x-ray telescope (Slone, P. et al., Grazing Incidence X-ray Reflectivity: Studies for the AXAF Observatory, SPIE Proc., Vol. 1546, 1991) seem ideal because the reflecting surface can be tailored to the desired energy range; however, these optics are far too large for SEM, TEM, synchrotron or x-ray lasers. Needed for detection of x-ray lines from elements with Z<18 in these applications are very small optics, under 2 cm in diameter and 10 cm in length, which offer high throughput, a large acceptance angle, wide range of energy performance and low cost.

A paraboloidal reflecting figure is an optimal choice to meet these requirements because, with the source of x-rays at its focus, the emerging radiation is very well collimated. Because of the small grazing angles involved, an off-axis reflector is needed. The optic in FIG. 2 is an off-axis paraboloid of revolution wherein the largest grazing angles occur at the entrance aperture and the smallest grazing angles occur at the exit aperture. At photon energies below 3000 eV, the grazing angles are sufficiently high that optics using one or two reflections can accept a large solid angle.

Such paraboloidal reflecting figures have not been successfully used before in SEM, TEM, synchrotron and x-ray laser applications due to the technical difficulty and expense of fabricating them. One of the biggest problems has been producing an extraordinarily smooth surface on the inside of these long, narrow optics. Micro-roughness reduces the reflectivity of a surface by the amount given by:

$$R = R_0 \exp\left(-(4\pi\sigma \sin \Theta/\lambda)^2\right)$$

where
R and $R_0$=reflectivity
$\sigma$=rms surface roughness
$\Theta$=grazing angle
$\lambda$=photon wavelength At x-ray energies from 500–2000 eV and grazing angles between 1 to 6 degrees, a surface roughness of less than 20 Angstroms is required to obtain high reflectivity. Exit apertures will be less than 2 cm and the optics may be as long as 10 cm. These optics will also require reflecting surfaces of specific materials, depending on the x-ray energy to be collimated.

Until now, it has not been possible to apply the needed reflecting surfaces to the inside of such long, narrow tubes without obtaining a surface which is excessively rough to provide adequate reflection. Previous fabrication techniques, such as optical electroforming and optical surface replication, have produced similar shapes or similar surface quality but have not been successfully used to produce the ultra low roughness needed on the inside surfaces of such narrow aperture optics.

OBJECTS OF ADVANTAGES

Accordingly, several objects and advantages of the present invention are:

a) to solve the practical problem of fabricating reflectors of small size with unusual surface geometries, such as, in the case of the preferred embodiment here, a tubular paraboloid;

b) to provide for fabrication of reflectors of small size in unique geometries and of reflective properties suitable for a desired energy range;

c) to provide for fabrication of reflectors of small size, unique geometries and reflective properties in an easily reproducible, replicative and inexpensive way;

d) to provide a small optic of increased flux gain, which would increase the practicality of wavelength dispersive spectroscopy as an analytical technique;

e) to provide an optic to allow a small detector to accept a large solid angle, act as a low energy pass filter to remove most of the background continuum and thereby make analysis of low concentrations of low Z elements via energy dispersive spectroscopy much more feasible;

f) to provide a process for inexpensively fabricating many copies of an ultra smooth reflecting surface in unusual geometries and suitable for small reflectors;

g) to enable fabrication of surfaces providing a two or higher reflection geometry.

List of Reference Numerals

10 First tubular paraboloid or first reflector.
12 Second tubular paraboloid or second reflector.
14 Aperture stop.
16 Spoke.
18 Entrance aperture.
20 Exit aperture.
22 Point source of x-rays.
24 Truncated cone reflector.

SUMMARY

This invention teaches a device for collimating x-rays comprising a reflector fabricated in the geometry of a tubular paraboloid and of a single layer of a predetermined material suitable for reflecting x-rays of selected wavelengths. In addition, a process for fabrication of said reflectors is also claimed. The fabrication process is suited for production of very small optics, such as a tubular paraboloid or other figure of revolution, comprising a reflecting surface of a single material, which optics are particularly useful for x-ray spectroscopy systems in scanning or transmission electron microscopy instruments or electron microprobes.

DESCRIPTION OF THE INVENTION

Figure 1:
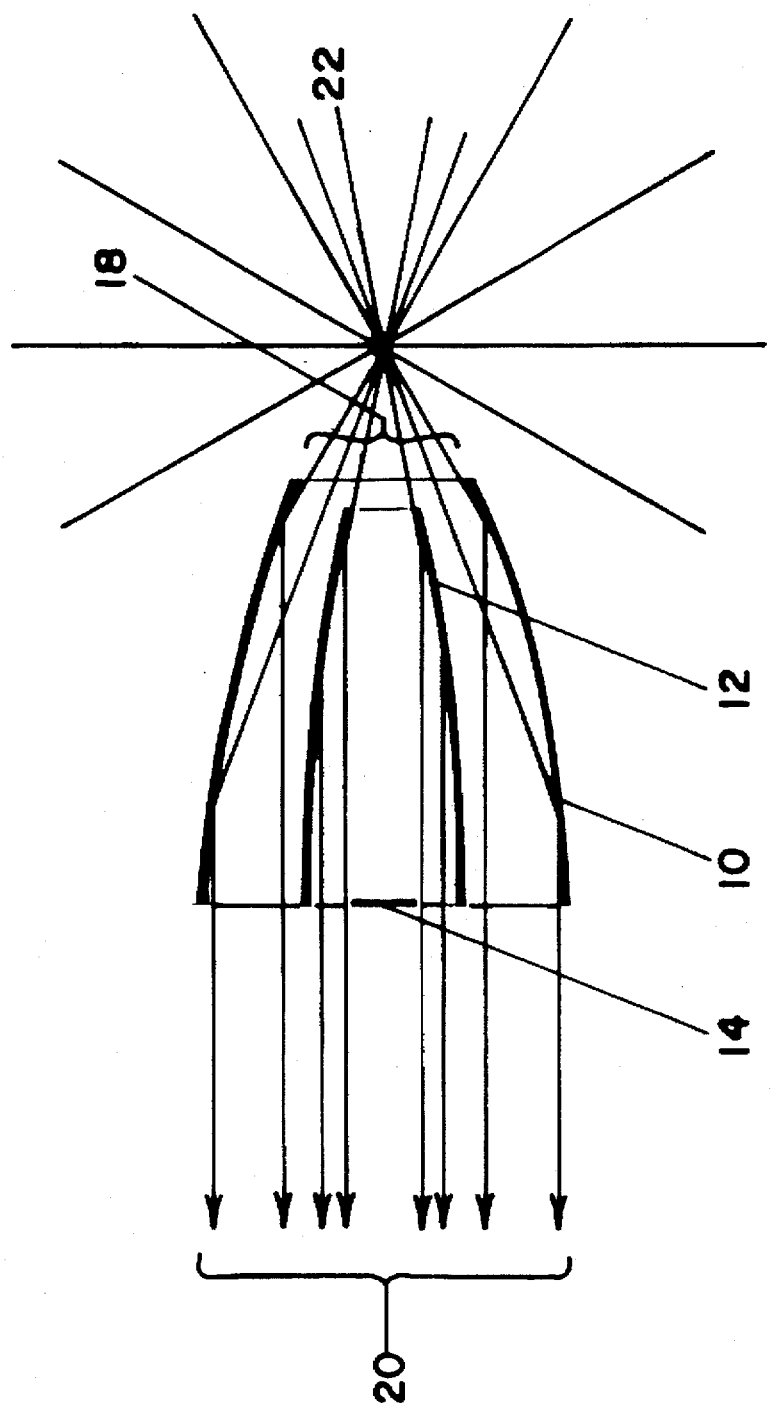
FIG. 1 is a longitudinal cross sectional view of the preferred embodiment, in relation to other components as might be used in an x-ray spectrometer.
Figure 2B:
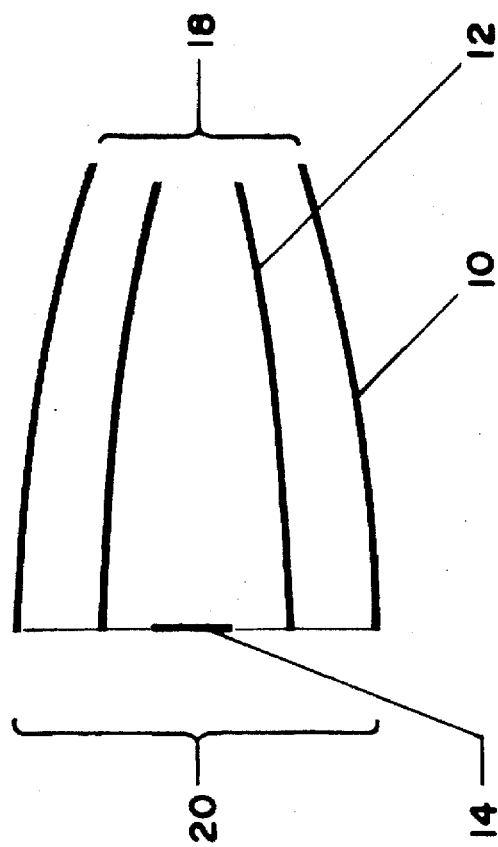
FIG. 2 shows a transverse cross sectional view (FIG. 2a) of the preferred embodiment and a longitudinal cross section (FIG. 2b).
Figure 2A:
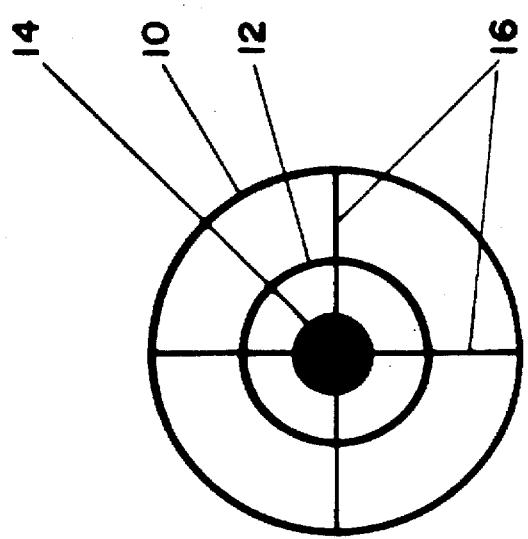

FIGS. 1 and 2 show views of the preferred embodiment of the present invention, a collimator for x-rays. The collimator is in the general shape of a tube, having two apertures, an entrance aperture 18 and an exit aperture 20. The walls of the collimator tube are not parallel to each other but rather are paraboloidal in longitudinal section, as shown in FIG. 2b. The geometry of the collimator tube is, therefore, circular in transverse cross-section, as shown in FIG. 2a, and paraboloidal in longitudinal section, as shown in FIG. 2b, thereby resulting in a tube whose entrance aperture 18 is of a smaller diameter than its exit aperture 20. Said collimator geometry is referred to herein as a tubular paraboloid.

Figure 3:
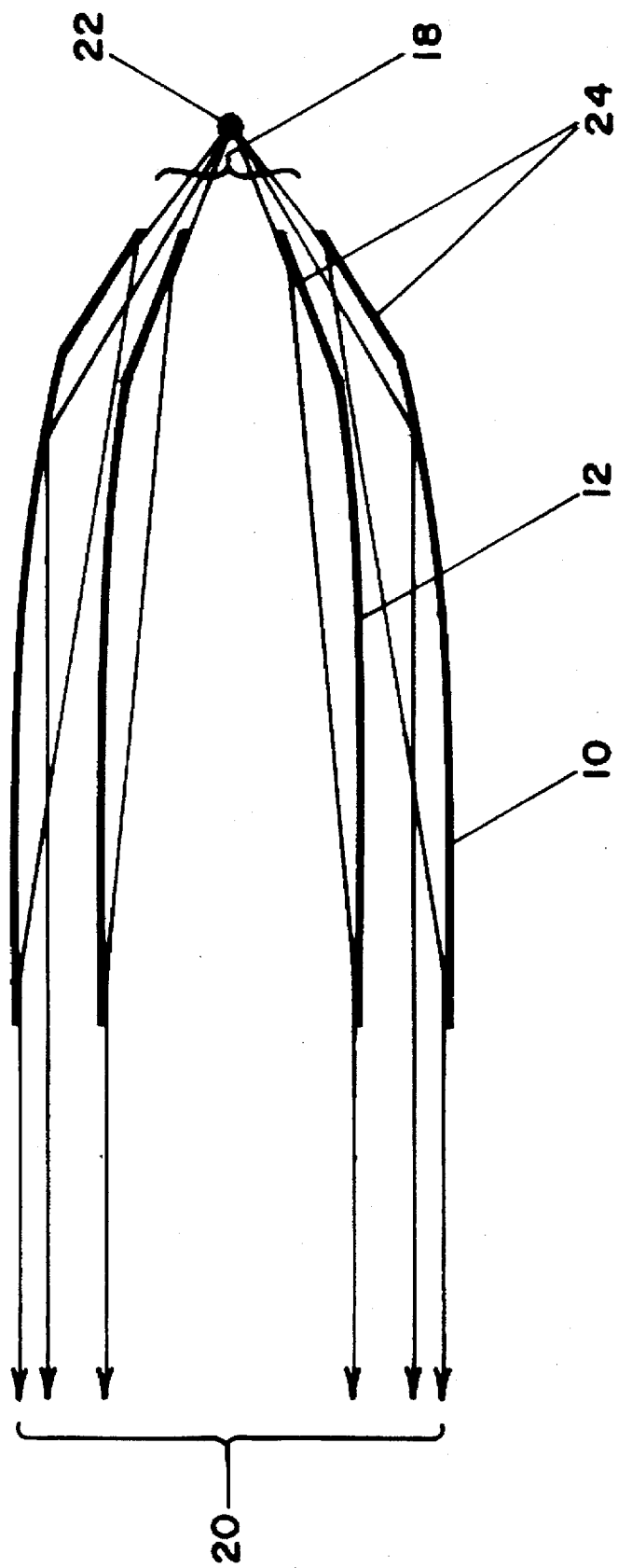
FIG. 3 shows an alternate embodiment comprising a tubular paraboloid with a truncated cone reflector at the entrance aperture.

The collimator, in its preferred embodiment, comprises a first tubular paraboloid 10, or first reflector, and a second tubular paraboloid 12, or second reflector, each having an outer surface and an ultrasmooth, reflecting inner surface, the second reflector being of smaller diameter than the first reflector and being held by suitable means 16 in assembly concentrically with the first reflector, thereby defining an entrance aperture 18 and an exit aperture 20. A point source of x-rays 22 is usually provided and is disposed at the focal point of the reflector. The entire assembly may be disposed within a protective housing. Alternate embodiments may employ more than two nested paraboloid reflectors and may also comprise a truncated cone reflector 24 at the entrance aperture to provide a two reflection figure, as shown in FIG. 3.

In addition, a process has been developed suitable for fabrication of optics with very small apertures and ultra smooth interior reflecting surfaces. Many types of reflecting surfaces may be produced, including gold, copper, nickel, palladium and others. The process is a replication method, so that once a master surface for an optic has been prepared, subsequent copies can be inexpensively reproduced. Thus, the fabrication process described below is best suited for the production of many identical optics, rather than one-of-a-kind devices, and in a variety of unusual geometries in addition to tubular paraboloids.

Selection of a reflecting surface and collimator design.

Figure 4:
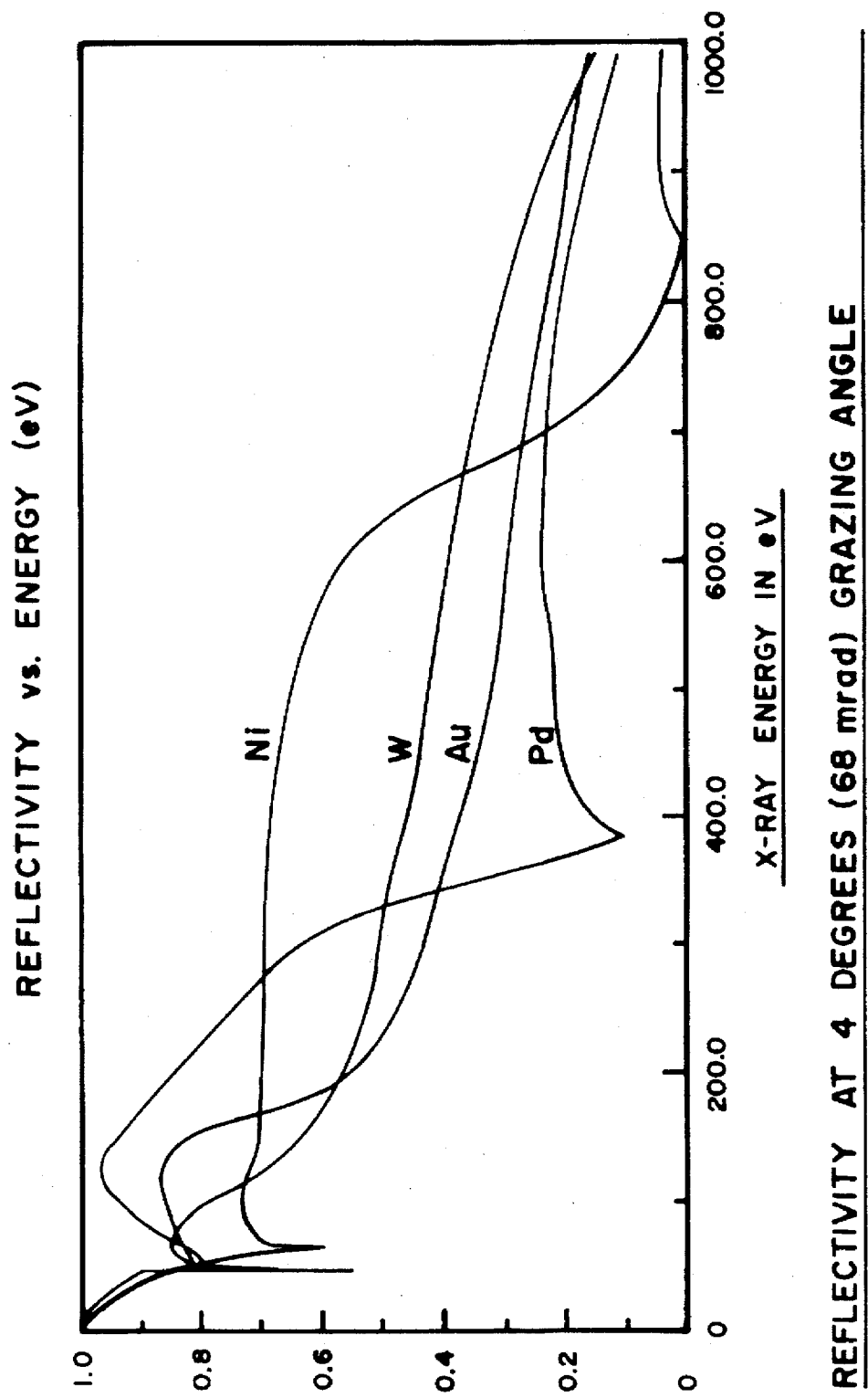
FIG. 4 illustrates the reflectivity of a smooth surface of gold, nickel or palladium for an x-ray energy range covering the K x-ray lines of the elements boron, carbon, nitrogen and oxygen at grazing angle of 4 degrees.

In designing these optics, calculations are first performed of the x-ray reflectivity of various surfaces at various energies and angles. FIG. 4 illustrates the reflectivity of a smooth surface of gold, nickel, palladium or tungsten for an x-ray energy range covering the K x-ray lines of the elements boron, carbon, nitrogen and oxygen at a grazing angle of 4 degrees. These reflectivity curves were calculated from values of the optical constants tabulated by Henke, B. L., et al., The Atomic Scattering Factor, $f_1+if_2$, for the 94 Elements and for the 100 to 2000 eV Photon Energy Region, University of Hawaii, Department of Physics and Astronomy, 1982.

After examining curves for many potential reflecting surfaces, nickel was selected for the preferred embodiment as most suited to reflect x-rays in the energy range of up to 700 eV, since it provides a more uniform high reflectivity than other surfaces and oxidation is not a severe problem. Other reflecting surfaces may be better suited for higher energies. A maximum grazing angle of 6 degrees was chosen for the optic on the basis of the reflectivity calculations. The reflectivity of the oxygen K line is fairly low at this angle, however it is very high at the smaller angles corresponding to x-rays striking the optic closer to the exit aperture. Lower energy x-ray lines from the lower Z elements have fairly high reflectivity even at 6 degrees.

An exit aperture 20 of 1.8 cm was chosen for the preferred embodiment to correspond to the active area of dispersing crystals in current use. A length of 6.5 cm for the optic was chosen to easily fit into common spectrometer housings. Optics of other dimensions may also be fabricated for various other applications. These parameters, along with the maximum grazing angle, determine the equation of the paraboloidal reflecting surface.

If only one tubular paraboloid were employed as the single reflecting surface, the collimated x-rays would be concentrated into a narrow ring, leaving x-rays inside the ring uncollimated. To minimize this effect, the preferred embodiment of the present invention combines a smaller second tubular paraboloid, or second reflector, 12 disposed concentrically with the first, to collimate the x-rays inside the annular beam. In the preferred embodiment, the maximum grazing angle of the second reflector 12 is the same as the minimum grazing angle of the first reflector 10. This requirement, along with the length of the optic and the position of the common focal point of the reflectors, determines the equation of the second reflector 12.

The second reflector 12 produces an inner annular beam, however, the x-rays inside this inner annular beam are sufficiently collimated that they do not require a further reflection and represent a very small portion of the x-rays emitted in the collected solid angle. A plurality of concentrically nested tubular paraboloid reflectors may be employed in an application requiring further collimation of the x-ray beam. Alternatively, a stop 14 may be provided at the exit aperture 20 to block uncollimated x-rays from exiting the device.

The first, outermost, reflector 10 is electroformed to a thickness providing a shell sufficiently strong to aid in concentrically holding the second, innermost, reflector 12. The second reflector 12, or the plurality of concentrically nested reflectors, is electroformed sufficiently thinly so as not to block much solid angle, yet to a thickness sufficient to hold its correct shape. Time of electroformation must be determined empirically by trial and error and depends on the particularities of the bath solution, power source, etc.

To calculate the gain of the optic, the x-ray flux at the exit aperture 20 is compared to the x-ray flux contained in the half-cone acceptance angle of the dispersing element. If the throughput of the optic were 100%, the gain would be the ratio of the solid acceptance angle of the optic to that of the dispersing element without the optic. The half-cone acceptance angle of the dispersing element is defined as the angular full width at half maximum of the rocking curve of the dispersing element. Reduced throughput is accounted for as a function of angle by using the reflectivity as a function of angle for a specific energy and surface roughness. Gain is a function of x-ray energy, since reflectivity increases for decreasing energy and the effect of roughness is less pronounced for lower energy photons. Lower energy lines will have better gains than higher energy lines; this higher gain may partially offset losses for lower energy lines in detector windows.

Collimator fabrication

A master mandrel, or mold, is constructed from aluminum alloy which has been heat treated to relieve internal stresses. A mandrel is prepared in an appropriate size and configuration for each of the reflectors. The figure geometry, paraboloidal in this case, is cut onto the cylindrical mandrels by precision turning with a diamond point.

Following turning of the initial figure, the mandrels are coated with optical grade electroless nickel to a thickness of approximately 20 micrometers, resulting in a layer sufficiently thick to withstand polishing, yet not thick enough to spontaneously peel. The coated mandrels are then turned once again with a diamond point, or polished, to shape the nickel coating into the paraboloidal figure. This second turning step may not be necessary if the nickel coating is sufficiently thin to avoid distortion of the initially cut figure.

The turning process leaves minute grooves which must be removed from the nickel surface. This is accomplished by polishing with a slurry of diamond powder or other suitable polishing agent and a lap. This step is repeated with successively finer grades of polishing agent until the desired surface is obtained. Through this process a surface roughness below 20 Angstroms is achieved; surface roughness is measured through either optical profilometry or atomic force microscopy.

The mandrel is then coated with acrylic lacquer by dipping it into a tank containing the lacquer and allowing the level of the lacquer to recede below the level of the mandrel. Rohm & Haas lacquer B48S has been found to perform well in this application. Through this step, a layer approximately 5 micrometers thick is deposited onto the surface of the mandrel. The surface tension of the lacquer deposited produces a surface with a roughness of approximately 5 Angstroms. This step provides several advantages: it is an inexpensive method for achieving ultrasmoothness, the step can be repeated after each use of the mandrel, thus renewing the ultrasmooth surface for continued use; in addition, the lacquer protects the mandrel, without it the mandrel would require repolishing after a few replications, thus increasing cost. After lacquer coating, the surface must be cured for several hours at a temperature above its glass transition temperature to help evaporate solvents and to provide a smooth lacquer surface.

Following lacquer deposition, also known as lacquer polishing, a smooth layer of gold, approximately 400 Angstroms thick, is deposited onto the mandrel through electron beam evaporation or other vapor deposition technique. This is accomplished by rotating the mandrel behind a mask with a turning apparatus, so that the gold atoms arrive perpendicular to the surface of the mandrel. Gold is used in the preferred embodiment since it is sufficiently soft to allow for spontaneous relief of the stresses that develop in the growing film, thus preventing cracks from developing in the film. In addition to gold, palladium, copper or other soft x-ray reflective materials may be used in this process. If a surface of a hard material, such as tungsten, is desired for a particular application, the material must be deposited directly onto the mandrel, omitting the lacquer polishing step.

A layer of low stress nickel is electroformed onto the gold coated lacquered mandrel. Very low stress in the nickel is necessary, otherwise stress will distort the optic. A method developed by D. Englehaupt, of the University of Alabama at Huntsville, has been adapted to this process to achieve a low stress condition in the nickel. Englehaupt, D. E., et al., Replication of Wolter 1 X-Ray Mirrors by Electroforming Techniques, SPIE Proc., Vol. 2279, 1994. Englehaupt's technique has been used to make optics for various x-ray astronomy projects, including the AXAF telescope. This step requires the use of a stress monitor to control the current density in the electroforming bath. In addition, careful adjustment of electrode geometry and bath chemistry are necessary to ensure that stresses are low over the entire surface.

For the preferred embodiment, the electroforming bath is nickel sulfonate buffered to an approximate pH of 3.0, since test results have indicated that low stress is more easily achieved in a low pH environment. Nickel bromide is used to promote anode corrosion, rather than the usual nickel chloride, since nickel bromide produces a lower stress deposit. In addition, a stress reducing compound, such as either naphthalene tri-sulfonic acid or saccharin, is used in low concentration. With the addition of a stress reducing compound, the stress in the deposit is a function of current density. At low current density (5 amp/ft$^2$ or less), the stress is compressive, while at higher current densities it is tensile. The preferred bath is operated at slight tensile stress, approximately 1,000 p.s.i., which allows easier separation of the reflector from the underlying mandrel. The current density required to achieve a given stress must be empirically determined, since it is a function of many variables. Once a current density has been predetermined to yield the desired stress, the thickness of the deposit is a linear function of deposition time. For the preferred embodiment herein, deposition times have been found to range from 8–24 hours. Other investigators have related that the temperature of the electroforming bath may seriously affect the lacquer surface. Lower temperatures appear to promote smoother lacquer surfaces. Therefore, for the present invention, electroforming is performed at approximately 85° F. This requires a low current density to achieve low stress.

Following electroformation of the nickel layer onto the gold layer, the bilayer must be released from the underlying mandrel. The coated mandrel is immersed in liquid nitrogen, causing the aluminum mandrel to contract in volume to a greater extent than the overlying nickel-gold bilayer, allowing the bilayer to release. The released bilayer is then disengaged from the underlying mandrel through the use of a press. The mandrel may then be reused after it is cleaned and recoated with lacquer.

The released bilayer is composed of an inner layer of gold and an outer layer of nickel. The layer of gold is removed by immersing the optic in a stripper solution of potassium cyanide, such as "Copkia Rip Au2", sold by Uyemura International Co. This step removes the gold without attacking the nickel, thus yielding a reflector with an inner surface of nickel.

The first and second reflectors fabricated through this process must then be arranged and held in accurate co-alignment, so that their foci and optical axes coincide. Two small spokes 16, usually 0.016 inch thick steel with small notches cut into them, are used at both the entrance and exit apertures to securely hold the reflectors in proper alignment. The assembly of first and second reflectors, held in concentric alignment by the spokes, is disposed within a protective housing, usually of aluminum or stainless steel.

OPERATION OF THE INVENTION

Those skilled in the art will appreciate that this invention provides a geometry previously unavailable in such a small reflector. The operation of the invention is dependent on its tubular paraboloid reflector geometry and on the arrangement of nested reflectors in the specified geometry. Because of this geometry and through the plurality of nested reflectors, the device is able to align incident isotropic x-rays into a well collimated beam.

The invention further provides for a process of fabrication allowing the inexpensive production of replicate copies of tubular paraboloid reflectors. These reflectors may be fabricated with varying reflecting surfaces chosen specifically for the energy of the x-rays desired to be collimated.

Through its tubular paraboloid geometry, the reflectors receive incident x-rays and reflect them while functioning essentially as collimating lenses. In the alternate embodiment, the tubular paraboloid reflector may be constructed with a truncated cone reflector proximal to the entrance aperture in order to provide a two-reflection optic, resulting in increased collimation efficiency.

What is claimed is:

1. A process for fabricating a paraboloidal shape suitable for reflecting x-rays of a predetermined range of wavelengths, said process comprising the steps of:

preparing a master mandrel by cutting said paraboloidal shape onto a mandrel by turning, said mandrel being of a predetermined material selected from the group consisting of aluminum and aluminum alloys;

coating said master mandrel with electroless nickel;

depositing onto said master mandrel a first layer of a predetermined material selected from the group consisting of metals and their alloys;

depositing onto said master mandrel a second layer of a predetermined material selected from the group consisting of x-ray reflective substances, thereby forming a bilayer;

employing means for separating said bilayer from said master mandrel.

2. The process defined in claim 1, wherein said means for separating said bilayer from said master mandrel is differential thermal contraction.

3. The process defined in claim 2, further employing means for dissociating said bilayer, thereby leaving said second layer intact.

4. The process defined in claim 1, wherein said means for separating said bilayer from said master mandrel is differential thermal expansion.

5. The process defined in claim 4, further employing means for dissociating said bilayer, thereby leaving said second layer intact.

6. The process defined in claim 1, further comprising the step of coating said master mandrel with acrylic lacquer prior to depositing said first layer.

7. The process defined in claim 6, wherein said means for separating said bilayer from said master mandrel is differential thermal contraction.

8. The process defined in claim 7, further employing means for dissociating said bilayer, thereby leaving said second layer intact.

9. The process defined in claim 6, wherein said means for separating said bilayer from said master mandrel is differential thermal expansion.

10. The process defined in claim 9, further employing means for dissociating said bilayer, thereby leaving said second layer intact.

* * * * *